(12) United States Patent
Yamasaki et al.

(10) Patent No.: US 9,287,448 B2
(45) Date of Patent: Mar. 15, 2016

(54) SEMICONDUCTOR LIGHT EMITTING ELEMENT

(75) Inventors: Hironori Yamasaki, Fukuoka-ken (JP); Katsuyoshi Furuki, Fukuoka-ken (JP); Yukie Nishikawa, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 677 days.

(21) Appl. No.: 13/053,527

(22) Filed: Mar. 22, 2011

(65) Prior Publication Data
US 2012/0146072 A1 Jun. 14, 2012

(30) Foreign Application Priority Data
Dec. 13, 2010 (JP) .................................. 2010-276839

(51) Int. Cl.
*H01L 33/60* (2010.01)
*H01L 33/22* (2010.01)
*H01L 33/16* (2010.01)
*H01L 33/20* (2010.01)

(52) U.S. Cl.
CPC ................. *H01L 33/22* (2013.01); *H01L 33/16* (2013.01); *H01L 33/20* (2013.01)

(58) Field of Classification Search
CPC .......... H01L 33/22; H01L 33/16; H01L 33/20
USPC ............................................. 257/98, E33.072
IPC .................................. H01L 33/22, 33/16, 33/20
See application file for complete search history.

(56) References Cited

U.S. PATENT DOCUMENTS

| | | | |
|---|---|---|---|
| 7,692,203 B2 | 4/2010 | Konno et al. | |
| 2002/0135996 A1* | 9/2002 | Suga | 362/31 |
| 2002/0195609 A1* | 12/2002 | Yoshitake | H01L 33/44 257/81 |
| 2005/0179130 A1* | 8/2005 | Tanaka et al. | 257/730 |
| 2005/0212002 A1* | 9/2005 | Sanga et al. | 257/96 |
| 2008/0061307 A1* | 3/2008 | Ikeda | H01L 33/22 257/94 |
| 2010/0059776 A1 | 3/2010 | Barnes et al. | |
| 2010/0065813 A1 | 3/2010 | Kondo et al. | |
| 2011/0291133 A1 | 12/2011 | Tanaka et al. | |
| 2012/0018752 A1 | 1/2012 | Fujiwara et al. | |

FOREIGN PATENT DOCUMENTS

| CN | 1947270 A | 4/2007 |
|---|---|---|
| CN | 101075652 A | 11/2007 |
| JP | 2008103627 | 5/2008 |

(Continued)

OTHER PUBLICATIONS

English Abstract of JP 2012129234 A. Jul. 2012.*

(Continued)

*Primary Examiner* — Hrayr A Sayadian
(74) *Attorney, Agent, or Firm* — White & Case LLP

(57) ABSTRACT

According to one embodiment, a semiconductor light emitting element includes a light emitting layer, a current spreading layer of a first conductivity type, and a pad electrode. The light emitting layer is capable of emitting light. The current spreading layer has a first surface and a second surface. The light emitting layer is disposed on a side of the first surface. A light extraction surface having convex structures of triangle cross-sectional shape and a flat surface which is a crystal growth plane are included in the second surface. The pad electrode is provided on the flat surface. One base angle of the convex structure is 90 degrees or more.

10 Claims, 8 Drawing Sheets

(56) References Cited

FOREIGN PATENT DOCUMENTS

| JP | 2009206265 | | 9/2009 |
|---|---|---|---|
| JP | 2012129234 | A * | 7/2012 |
| TW | 200605398 | | 1/2006 |
| TW | 200835765 | | 1/2008 |
| WO | 2010/131680 | A1 | 11/2010 |

OTHER PUBLICATIONS

Japanese Office Action for Japanese Application No. 2010-276839 mailed on Jul. 6, 2012.

Taiwanese Office Action issued on Nov. 27, 2013 in corresponding Taiwanese Application No. 100131467, along with English translation.

Chinese Office Action issued on Dec. 6, 2013 in corresponding Chinese Patent Application No. 201110266714.3, along with English translation.

Chinese Office Action issued on Jan. 16, 2015 in the counterpart Chinese patent application No. CN 201110266714.3 and an English translation thereof, for the above-identified US patent application.

Chinese Office Action issued on Jul. 25, 2014 in corresponding Chinese Application No. 201110266714.3, along with English traslation thereof.

* cited by examiner

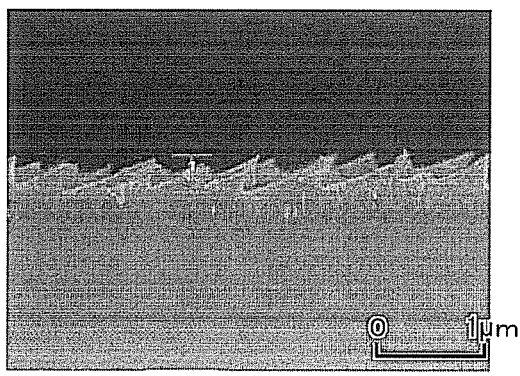
FIG. 3A　　　DC
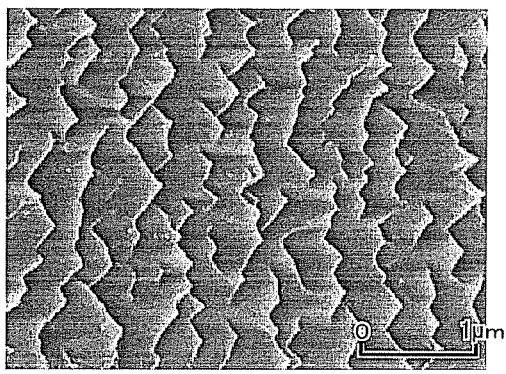
SURFACE TILTED AT 15 DEGREES FROM (-100) PLANE TO [011] DIRECTION
FIG. 3B　　　DU
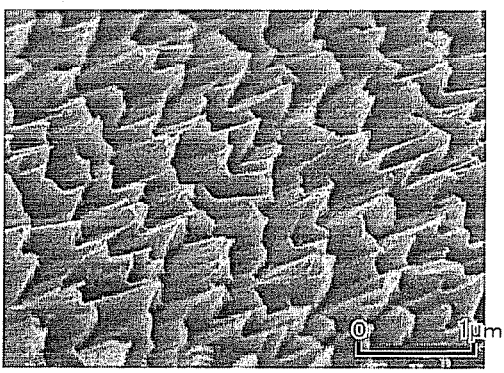
FIG. 3C　　　DF$_{40}$
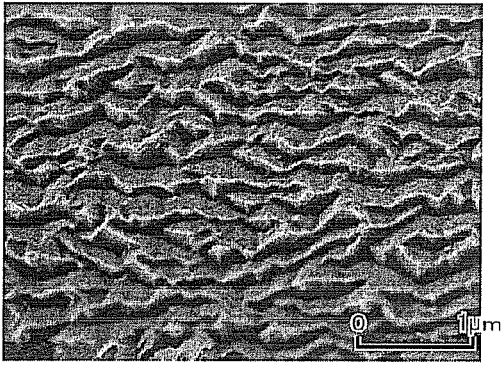
FIG. 3D　　　DS$_{40}$

SEMICONDUCTOR LIGHT EMITTING ELEMENT

CROSS-REFERENCE TO RELATED APPLICATIONS

This application is based upon and claims the benefit of priority from the prior Japanese Patent Application No. 2010-276839, filed on Dec. 13, 2010; the entire contents of which are incorporated herein by reference.

FIELD

Embodiments described herein relate generally to a semiconductor light emitting element.

BACKGROUND

High light extraction efficiency (efficiency of extracting light emitted from a light emitting layer to the outside of a semiconductor light emitting element) is required for semiconductor light emitting elements used in illumination devices, display devices, traffic signals, etc.

By providing a reflection layer under a light emitting layer in a semiconductor light emitting element having a stacked structure, it is possible to increase the light extraction efficiency of the semiconductor light emitting element. In addition, by forming fine uneven surface on a light extraction surface provided on a side opposite to the reflection layer via the light emitting layer, it is possible to further increase the light extraction efficiency. However, it is difficult to sufficiently increase the light extraction efficiency with the uneven surface.

BRIEF DESCRIPTION OF THE DRAWINGS

FIG. 3A is a SEM photograph of a cross-section along line K-K (direction DC) of the light extraction surface, FIG. 3B is a SEM photograph as viewed from directly above the light extraction surface (direction DU), FIG. 3C is a SEM photograph as viewed from the upward direction in 40 degrees obliquely on the front side $DF_{40}$, and FIG. 3D is a SEM photograph as viewed from the upward direction in 40 degrees obliquely on the lateral side $DS_{40}$;

DETAILED DESCRIPTION

In general, according to one embodiment, a semiconductor light emitting element includes a light emitting layer, a current spreading layer of a first conductivity type, and a pad electrode. The light emitting layer is capable of emitting light. The current spreading layer has a first surface and a second surface. The light emitting layer is provided on a side of the first surface. A light extraction surface having convex structures with cross-sectional shape of triangle and a flat surface which is a crystal growth plane are included in the second surface. The pad electrode is provided on the flat surface. One base angle of the convex structure is 90 degrees or more.

Hereinafter, embodiments of the invention will be described with reference to the drawings.

Figure 1:
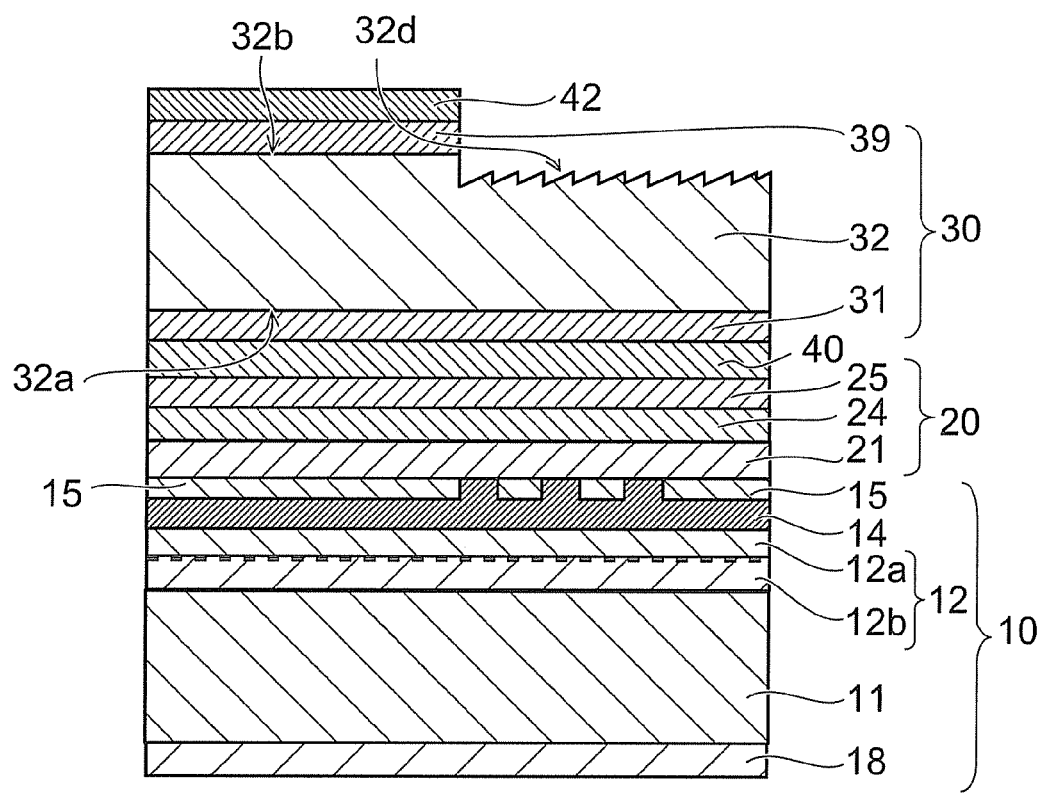
FIG. 1 is a schematic cross-sectional view of a semiconductor light emitting element according to a first embodiment of the invention.

FIG. 1 is a schematic cross-sectional view of a semiconductor light emitting element according to a first embodiment of the invention.

The semiconductor light emitting element is provided with a pad electrode 42, a first stacked structures 30 made of a semiconductor, a light emitting layer 40, a second stacked structure 20 made of a semiconductor, and a support substrate 10.

In FIG. 1, although the semiconductor stacked structure including the first stacked structure 30, the light emitting layer 40, and the second stacked structure 20 is made of an InAlGaP-based material represented by the composition formula $In_x(Al_yGa_{1-y})_{1-x}P$ ($0 \le x \le 1$ and $0 \le y \le 1$), the material is not limited thereto, and may be configured with an AlGaAs-based material represented by the composition formula $Al_xGa_{1-x}As$ ($0 \le x \le 1$), an InGaAlAsP-based material represented by the composition formula of $In_x(Al_yGa_{1-y})_{1-x}As_zP_{1-z}$ ($0 \le x \le 1$, $0 \le y \le 1$ and $0 \le z \le 1$), and an InGaAlN-based material represented by the composition formula $In_xAl_yGa_{1-x-y}N$ ($0 \le x \le 1$, $0 \le y \le 1$, and $x+y \le 1$), or a combination of these materials.

The first stacked structure 30 has a first conductivity type and includes a cladding layer 31 made of $In_{0.5}Al_{0.5}P$, a current spreading layer 32, and a contact layer 39 made of GaAs. Although the first conductivity type is an n-type in this embodiment, the invention is not limited thereto.

By configuring the light emitting layer 40 to have a MQW (Multi Quantum Well) structure including well layers and barrier layers which are made of $In_x(Al_yGa_{1-y})_{1-x}P$ ($0 \le x \le 1$ and $0 \le y \le 1$), it is possible to increase an internal quantum efficiency of emission light and also to have a wavelength range of a visible light.

The second stacked structure 20 has a second conductivity type and is provided between the light emitting layer 40 and the support substrate 10. The second stacked structure 20 includes a contact layer 21 made of GaP, AlGaAs, or the like, an intermediate layer 24 made of InGaAlP or the like, and a cladding layer 25 made of $In_{0.5}Al_{0.5}P$ or the like, in this order from the side of the support structure 10.

The support substrate 10 includes a substrate 11 made of Si or the like, a bonding metal layer 12 provided in an upper portion of the substrate 11, a lower electrode 18 provided on the rear surface of the substrate 11, an ITO (Indium Tin Oxide) film 14 provided on the bonding metal layer 12, and a current blocking layer 15 made of an insulator such as $SiO_2$ selectively provided on the ITO film 14. Light emitted downward from the light emitting layer 40 is reflected by the bonding metal layer 12, the current blocking layer 15, and the like, and the light is easily extracted from the light extraction surface.

Here, the first stacked structure 30, the light emitting layer 40, and the second stacked structure 20 are formed on a GaAs substrate, for example, by epitaxial growth technique. Subsequently, an insulating film such as $SiO_2$ is formed on the surface of the contact layer 21 and is left in a region under the pad electrode 42 and in a part for blocking current flow as the current blocking layer 15, by lithography patterning. The ITO film 14 and a metal layer 12a such as Au are formed on the patterned dielectric film. The GaAs substrate side having the metal layer 12a on the surface and the substrate 11 surface having a metal film 12b including Au or the like on the surface are faced each other, and heated and pressured to bond two substrate in one wafer state, and thus, the bonding metal layer 12 is formed. Here, a broken line indicates a bonded interface.

The current spreading layer 32 includes a first surface 32a and a second surface and has the first conductivity type. The light emitting layer 40 is provided on the first surface 32a side of the current spreading layer 32. Furthermore, the second surface includes a light extraction surface 32d having many convex structures and a flat surface 32b which is a surface of a crystal growth plane. Here, the pad electrode 42 is provided on the flat surface 32b of the current spreading layer 32 via the contact layer 39.

Figure 2A:
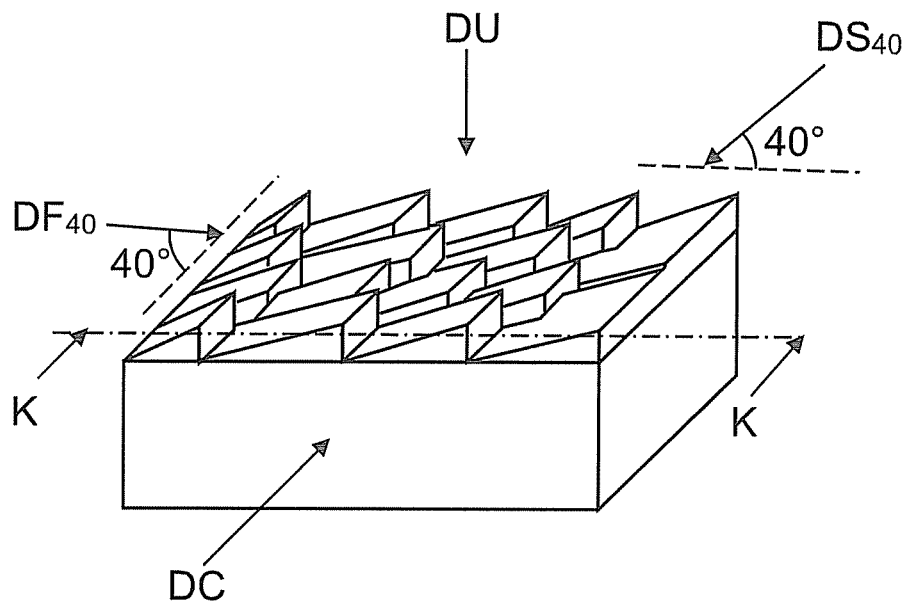
FIG. 2A is a schematic perspective view of a light extraction surface.
Figure 2B:
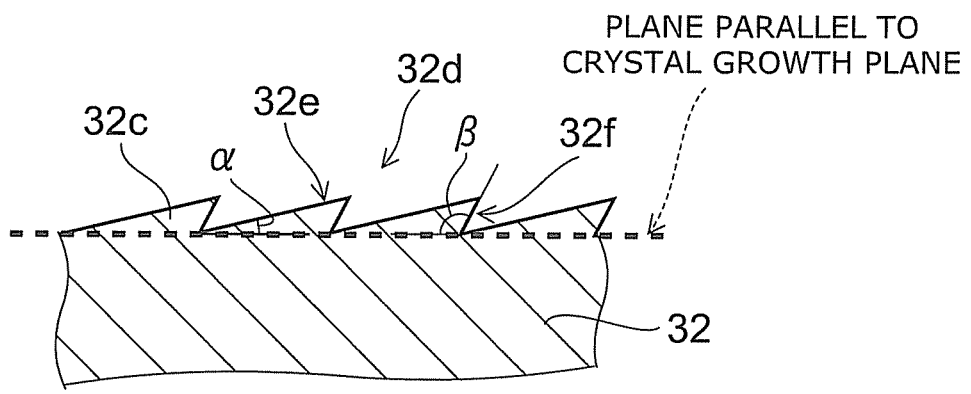
FIG. 2B is a schematic view of convex structures with cross-sectional shape of triangle taken along line K-K.

FIG. 2A is a schematic perspective view of the light extraction surface as viewed obliquely from above, and FIG. 2B is a schematic cross-sectional view taken along line K-K.

The convex structure 32c with cross-sectional shape of triangle provided on the current spreading layer 32 protrudes along line K-K and has a first side surface 32e and a second side surface 32f. The first side surface 32e has an angle α and the second side surface 32f has an angle β with respect to a plane parallel to a crystal growth plane which is the bottom portion of the convex structure 32c. The angle α and the angle β are defined as "base angles" of the convex structure. In the first embodiment, one of the two base angles α and β is 90 degrees or more. In the embodiment shown in FIGS. 2A and 2B, the base angle β is 90 degrees or more. It is possible to form such cross-section of the convex structure 32c by tilting the crystal growth plane using a tilted substrate and selecting an etching solution appropriately. A formation method thereof will be explained in detail below.

FIG. 3A is a SEM photograph of a cross-section along line K-K (direction DC) of the light extraction surface, FIG. 3B is a SEM photograph as viewed from directly above the light extraction surface (direction DU), FIG. 3C is a SEM photograph as viewed from the upward direction in 40 degrees obliquely on the front side $DF_{40}$, and FIG. 3D is a SEM photograph as viewed from the upward direction in 40 degrees obliquely on the lateral side $DS_{40}$.

In FIGS. 3A to 3D, the crystal growth plane is tilted at 15 degrees from the (−100) plane toward the [011] direction. That is, FIG. 3A shows a cross-section of the convex structure 32 as viewed from the direction DC of FIG. 2A, and corresponds to the schematic cross-sectional view of FIG. 2B. The cross-section in FIG. 3A is the (011) plane. Furthermore, FIG. 3B shows the light extraction surface as viewed from directly above the light extraction surface (direction DU), FIG. 3C shows the convex structure 32c as viewed from a direction of 40 degrees obliquely upward on the front side ($DF_{40}$), and FIG. 3D shows the convex structure 32c from a direction of 40 degrees obliquely upward on the just lateral side ($DS_{40}$).

Figure 4A:
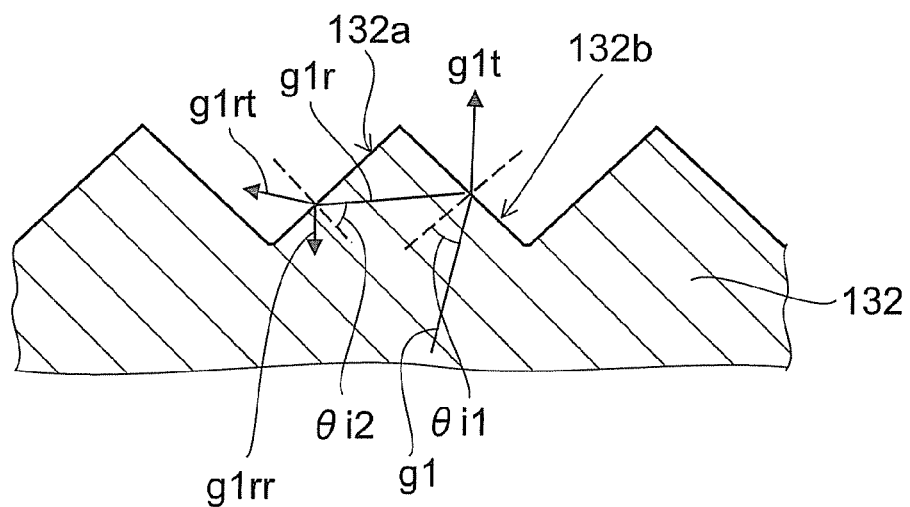
FIG. 4A is a schematic view illustrating a light extraction direction when both base angles of the convex structures are acute angles.
Figure 4B:
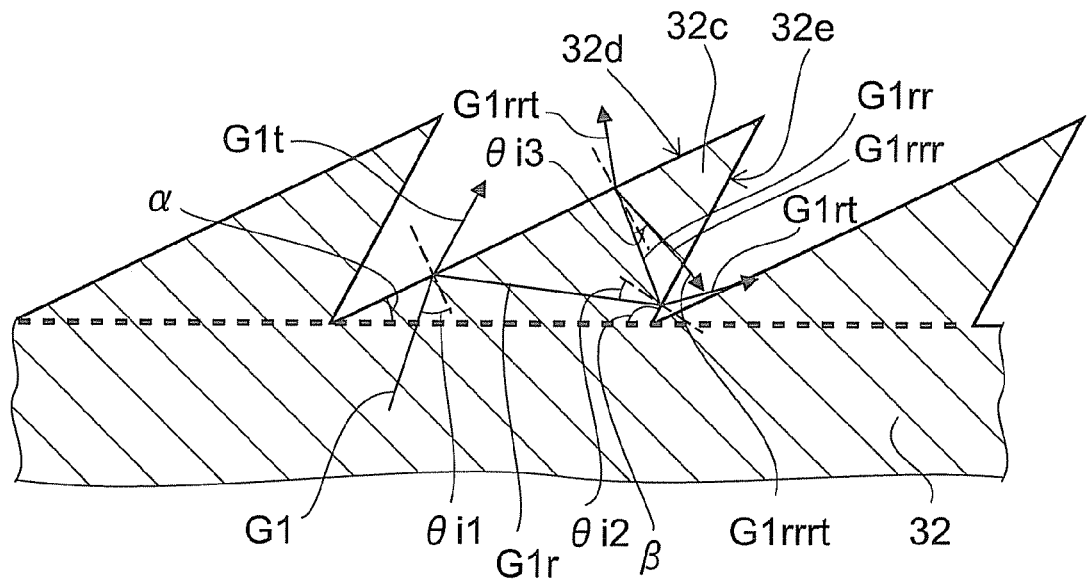
FIG. 4B is a schematic view illustrating a light extraction direction in a case of the first embodiment wherein one base angle of the convex structures is obtuse angle.

FIG. 4A is a schematic view illustrating a light extraction direction when both of the base angles have acute angles, and FIG. 4B is a schematic view illustrating a light extraction direction in a case of the first embodiment.

In FIG. 4A, emission light g1 from the light emitting layer enters a second side surface 132b of a convex structure 132 in an incident angle θi1. When the incident angle θi1 is smaller than a critical angle θc, transmitted light g1t and reflected light g1r are generated. When the incident angle θi1 is larger than the critical angle θc, total reflection occurs. When the reflected light g1r enters a first side surface 132a and an incident angle θi2 is smaller than the critical angle θc, transmitted light g1rt and reflected light g1rr are generated. When the incident angle θi2 is larger than the critical angle θc, it becomes difficult to extract the emission light further more because of the total reflection. When light extraction efficiency in a case without convex structures are defined to be 100%, the light extraction efficiency was 130% in the case where the convex structures of FIG. 4A were provided. Here, when the refractive index of the current spreading layer 32 is assumed to be 3.2 and the refractive index of a sealing layer covering the surface of a light emitting element is assumed to be 1.4, the critical angle θc becomes approximately 26 degrees.

In FIG. 4B, emission light G1 from the light emitting layer enters a first side surface 32d of the convex structure 32c, and, when the incident angle θi1 is smaller than the critical angle θc, transmitted light G1t and reflected light G1r are generated. Here, when the incident angle θi1 is larger than the critical angle θc, the total reflection occurs. When the reflected light G1r enters a second side surface 32e and the incident angle θi2 is smaller than the critical angle θc, transmitted light G1rt and reflected light G1rr are generated. Further, when the reflected light G1rr enters the first side surface 32d and the incident angle θi3 is smaller than the critical angle θc, the reflected light G1rr is transmitted.

In the first embodiment, since the surface area of the convex structure 32c can be increased, the number of reflections within the convex structure 32c becomes larger than that in the case of the shape shown in FIG. 4A and thus more emission light can be extracted. Accordingly, it is possible to increase the light extraction efficiency. The light extraction efficiency was 145% in a semiconductor light emitting element having the convex structures 32c as shown in FIG. 4B. Furthermore, it has been found from an experiment by the inventors that the light extraction efficiency can be increased to 150% compared with the light extraction efficiency of a light emitting element having a flat light extraction surface without convex structures when a range of the base angle α of the first side plane 32d is set to be a range from 35 degrees or more to 45 degrees or less.

When the light extraction surface is made of one of $In_x(Al_yGa_{1-y})_{1-x}P$ (0≤x≤1 and 0≤y≤1), $Al_xGa_{1-x}As$ (0≤x≤1), $In_x(Al_yGa_{1-y})_{1-x}AsZP_{1-z}$ (0≤x≤1, 0≤y≤1 and 0≤z≤1), and $In_xAl_yGa_{1-x-y}N$ (0≤x≤1, 0≤y≤1, and x+y≤1), it is easy to form the convex structures 32c with the base angle ≥90 degrees by setting a crystal growth plane tilted from the {100} plane with an angle between 10 degrees and 20 degrees. Furthermore, it is more preferable to set a tilt direction from the {100} plane to be an A plane direction which is the (111) group-III plane or a B plane direction which is the (111) group-V plane. Note that, the {100} plane includes equivalent planes represented by (100), (010), (001), (−100), (0-10), or (00-1).

On the wafer surface having such a tilt angle described above, the convex structures 32c with the base angle≥90 degrees as shown in FIG. 2B can be formed by using a wet etching method. They are so-called frost concave-convex structures. Crystal degradation by the wet etching process is suppressed compared with the dry etching process such as an RIE (Reactive Ion Etching) method. Thus, it is easy to keep a high luminance even in a long term operation with the convex structures formed by the wet etching process. Here, it is preferable to set the height of the convex structures 32c to be equal to or larger than 20 nm or the like, for example. It is possible to use a water solution containing hydrochloric acid, acetic acid, and hydrofluoric acid or the like, for example, for the wet etching solution.

The current spreading layer 32 can spread carriers injected from the pad electrode 42 in the plane of the light emitting layer 40. The contact layer 39 provided between the current spreading layer 32 and the pad electrode 42 is made of GaAs. The contact layer 39 is removed from the second surface of the current spreading layer 32 only in a region where the convex structures 32c are formed to provide make the desired light extraction surface 32d. The current spreading layer 32 is etched by using the contact layer 39 as a frost mask to form the frost having the convex structure 32c. In FIG. 1, although the contact layer 39 remains under the pad electrode 42, the pad electrode 42 can be formed directly on the flat current spreading layer 32 by removing the GaAs layer.

Furthermore, when a narrow-line electrode having a width of 10 μm or less, for example, is provided around the pad electrode 42, the narrow-line electrode can be provided on the GaAs layer. Alternatively, a self-aligned structure in which the narrow-line electrode is patterned on the GaAs layer and then GaAs is etched by using the narrow-line electrode as a mask can be employed. In this case, the frost concave-convex structures can be formed uniformly close to the vicinity of the narrow-line electrode and it is possible to increase the light extraction efficiency further more.

Figure 5:
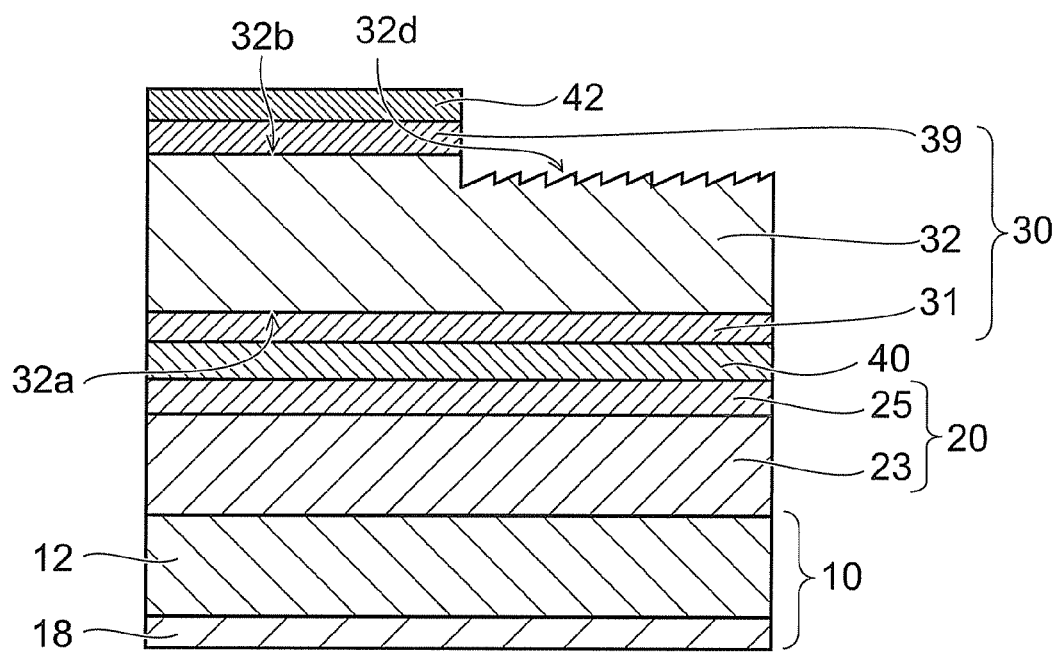
FIG. 5 is a schematic cross-sectional view of a semiconductor light emitting element according to a variation of the first embodiment.

FIG. 5 is a schematic cross-sectional view of a semiconductor light emitting element according to a variation of the first embodiment.

The semiconductor light emitting element is provided with a pad electrode 42, a first stacked structure 30 made of a semiconductor, a light emitting layer 40, a second stacked structure 20 made of a semiconductor, and a support substrate 10.

The first stacked structure 30 has the first conductivity type and includes a cladding layer 31 made of $In_{0.5}Al_{0.5}P$, a current spreading layer 32, and a contact layer 39 made of GaAs. Although the first conductivity type is an n-type, the invention is not limited thereto. By configuring the light emitting layer 40 to have a MQW structure including well layers and barrier layers which are made of $In_x(Al_yGa_{1-y})_{1-x}P$ ($0 \leq x \leq 1$ and $0 \leq y \leq 1$), it is possible to increase an internal quantum efficiency of the emission light and also to set the wavelength arbitrarily in a visible light range. The second stacked structure 20 has the second conductivity type, and a cladding layer 25 which is made of $In_{0.5}Al_{0.5}P$ or the like and provided between the light emitting layer 40 and a substrate 12 made of GaAs and a distributed Bragg reflector (DBR) layer 23 which is a multilayer film made of InGaAlP, GaAlAs or the like and selectively reflects light having a wavelength of the emission light from the light emitting layer 40 are formed on the substrate 12. The light emitted downward from the light emitting layer 40 is reflected by the DBR layer 23 and can be extracted from above. Furthermore, the rear surface of the substrate 12 is provided with a lower electrode 18.

The current spreading layer 32 includes a first surface 32a and a second surface 32b, and has the first conductivity type. The light emitting layer 40 is provided on the first surface 32a side of the current spreading layer 32. Moreover, the second surface includes a light extraction surface 32d having multiple convex structures and a flat surface 32b which is a crystal growth plane. Here, the pad electrode 42 is provided, for example, via the contact layer 39 on the flat surface 32b of the current spreading layer 32. It is also possible to employ a structure in which current does not flow directly under the pad electrode 42 by providing a current blocking layer between the pad electrode 42 and the contact layer 39. Also in the variation, it is possible to increase the light extraction efficiency up to 145% by forming the convex structures 32c as shown in FIG. 4B for the light extraction surface of the current spreading layer 32, in comparison with a case where convex structures are not formed. Furthermore, it has been found from an experiment by the inventors that the light extraction efficiency can be increased to 150% when the base angle α of the first side plane 32d is set between 35 degrees and 45 degrees, compared with that of a semiconductor light emitting element having a flat light extraction surface without convex structures. When the light extraction surface is made of $In_x(Al_yGa_{1-y})_{1-x}P$ ($0 \leq x \leq 1$ and $0 \leq y \leq 1$), it is easy to form the convex structure 32c by using a GaAs substrate tilted from the {100} plane with an angle range between 10 degrees and 20 degrees for the substrate 12. Furthermore, it is more preferable to set a tilt direction from the {100} plane to be the (111) group-III plane direction or the (111) group-V plane direction.

Figure 6A:
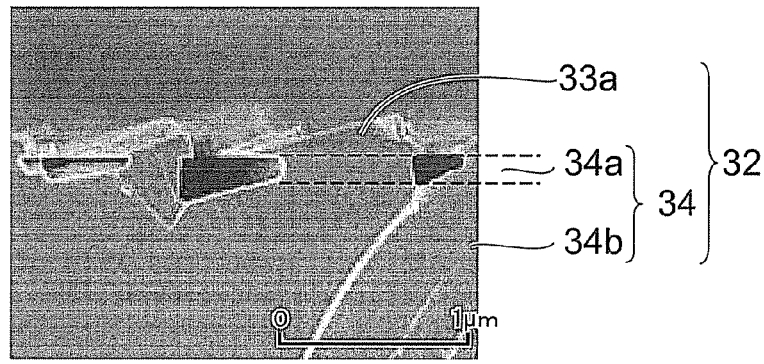
FIG. 6A is a cross-sectional SEM photograph of a convex structure of a semiconductor light emitting element according to a second embodiment.
Figure 6B:
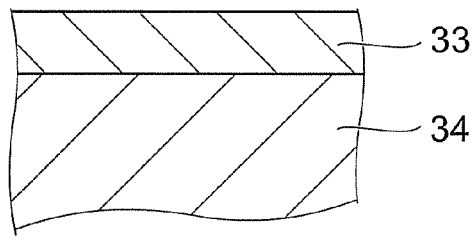
FIG. 6B is a schematic cross-sectional view before forming a convex structure.
Figure 6C:
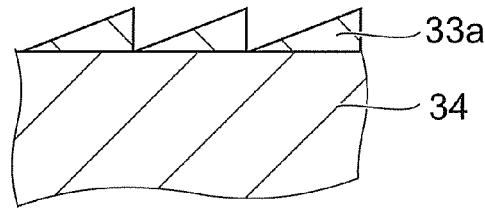
FIG. 6C is a schematic cross-sectional view after forming a convex structure portion.
Figure 6D:
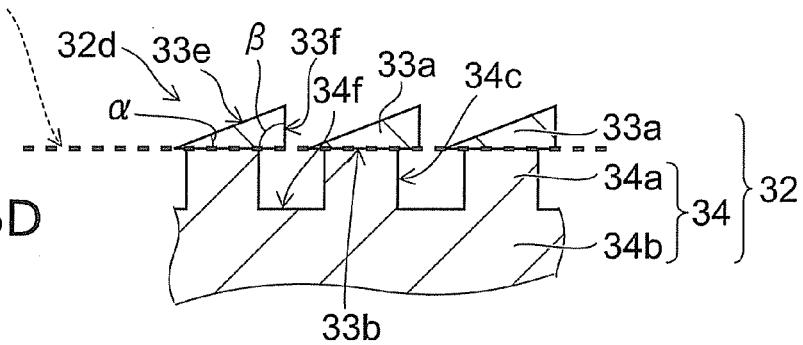
FIG. 6D is a schematic cross-sectional view after forming a pillar.

FIG. 6A is a cross-sectional SEM photograph of a convex structure of a semiconductor light emitting element according to a second embodiment, FIG. 6B is a schematic cross-sectional view before forming a convex structure, FIG. 6C is a schematic cross-sectional view after forming the convex structure, and FIG. 6D is a schematic cross-sectional view after forming a pillar.

A current spreading layer 32 includes a first surface and a second surface and has the first conductivity type. A light emitting layer is provided on the first surface side. On the second surface, there are provided a light extraction surface including a pillar 34a, a convex structure 33a provided on the pillar 34a, and a bottom portion 34b provided around the pillar 34a, and a flat surface having a surface of a crystal growth plane. At least a part of the bottom surface 33b of the convex structure 33a protrudes from a sidewall 34c of the pillar part 34a in the lateral direction. The light extraction efficiency was 140% in a semiconductor light emitting element having the convex structures 33a as shown in FIG. 6A. A head portion including the bottom surface 33b of the convex structure 33a which protrudes from the pillar 34a has a shape like a key head portion and realizes a high adhesion strength in which a sealing layer made of silicone resin or the like and the current spreading layer 32 are interlocked with each other. When the convex structure 33a is not provided with the head portion having a key shape, the sealing layer may be easily peeled off from the current spreading layer and the light output is reduced because of the light output direction shift.

At the bottom portion of the convex structure 33a provided in a first layer 33, a first side surface 33e and a second side surface 33f have angles α and β, respectively with respect to a plane parallel to the crystal growth plane. The angle α and the angle β are defined as "base angles".

As shown in FIG. 6B, the current spreading layer 32 includes the first layer 33 formed by crystal growth on an inclined substrate and a second layer 34, and the composition formula is represented by $In_x(Al_yGa_{1-y})_{1-x}P$ ($0\leq x\leq 1$ and $0\leq y\leq 1$). The first layer 33 has an Al composition ratio y of 0.3. Furthermore, the second layer 34 has an Al composition ratio y of 0.7 which is higher than the composition ratio y of the first layer 33. The etching rate of the first layer 33 is assumed to be approximately five times larger than that of the second layer 34. The protruding portion 33a has a saw-tooth-like cross-section in a state of just etching shown in FIG. 6B. The pillar part 34a is formed by additional etching in the second layer 34 having a higher etching rate as shown in FIG. 6D and the etching is finished when the pillar part 34a comes to have a desired height from the bottom plane 34f of the bottom part 34b. In this manner, the convex structure 33a having a key shape is provided for the current spreading layer 32, and thus it is possible to improve the adhesiveness between the surface of a semiconductor light emitting element and the sealing layer.

In the second embodiment, the convex structure 33a and the pillar 34a increase the surface area of the light extraction surface 32d to increase the number of light reflections, and thus, the light extraction efficiency can be increased. Furthermore, it has been found from an experiment by the inventors that the luminance can be increased when the Al composition ratio y of the current spreading layer 32 has a higher value of 0.7. Accordingly, the portion other than the convex structure 33a is configured with the second layer 34 which has a higher Al composition ratio y of 0.7.

Figure 7A:
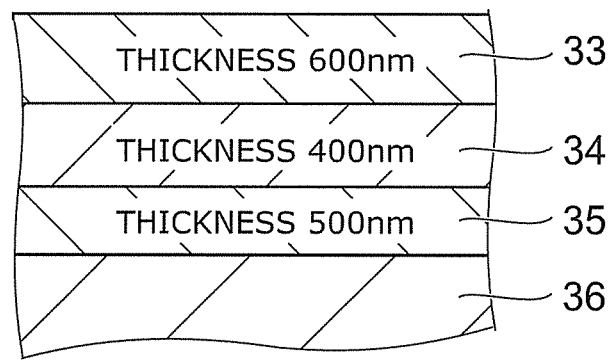
FIG. 7A is a schematic cross-sectional view illustrating a structure of a current spreading layer of a semiconductor light emitting element according to a third embodiment.
Figure 7B:
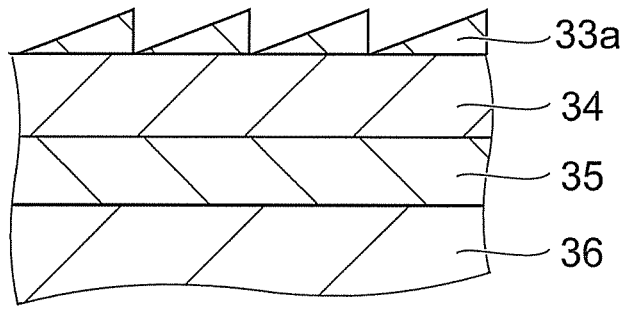
FIG. 7B is a schematic cross-sectional view after forming a convex structure.
Figure 7C:
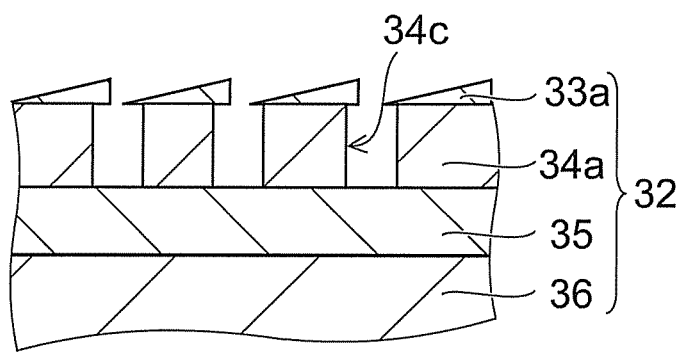
FIG. 7C is a schematic cross-sectional view after forming a pillar.

FIG. 7A is a schematic cross-sectional view illustrating a structure of a current spreading layer of a semiconductor light emitting element according to a third embodiment, FIG. 7B is a schematic cross-sectional view after forming a convex structure, and FIG. 7C is a schematic cross-sectional view after forming a pillar.

In the third embodiment, the current spreading layer 32 includes a first layer 33, a second layer 34, a third layer 35, and a fourth layer 36. The first layer 33 has an Al composition ratio y of 0.3 and a thickness of 600 nm. The second layer 34 has an Al composition ratio y of 0.7 and a thickness of 400 nm. The third layer 35 has an Al composition ratio y of 0.3 and a thickness of 500 nm. Furthermore, the fourth layer 36 has an Al composition ratio y of 0.7. Here, preferably, the first layer 33 has a thickness of 600 nm±200 nm, the second layer 34 has a thickness of 400 nm±200 nm, and the third layer 35 has a thickness of 500 nm±200 nm. Furthermore, preferably, the Al composition ratio y of the first layer 33 is 0.3±0.15, the Al composition ratio y of the second layer 34 is 0.7±0.15, and the Al composition ratio y of the third layer 35 is 0.3±0.15.

First, as shown in FIG. 7B, a convex structure 33a is formed in the first layer 33 after etching of 600 nm depth. Subsequently, by additional etching, a pillar 34a is formed having a height of approximately 600 nm since the etching rate of the second layer 34 is five times higher than that of the first layer 33. Since the etching rate of the third layer 35 is approximately one fifth lower than that of the second layer 34, the surface of the third layer 35 acts as an etching stop layer, and thus the height of the pillar 34a can keep accurately and also stably. By providing the fourth layer 36 having a high Al composition ratio y of 0.7, it can be improve the luminance.

Figure 8A:
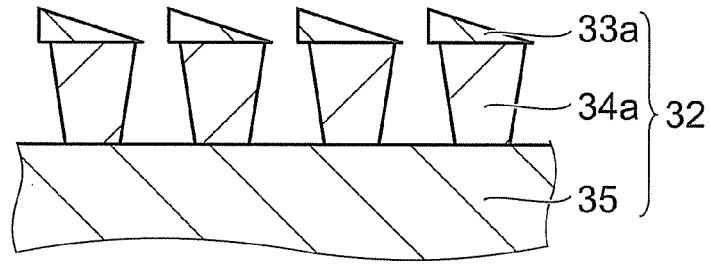
FIG. 8A is a first variation of the third embodiment.
Figure 8B:
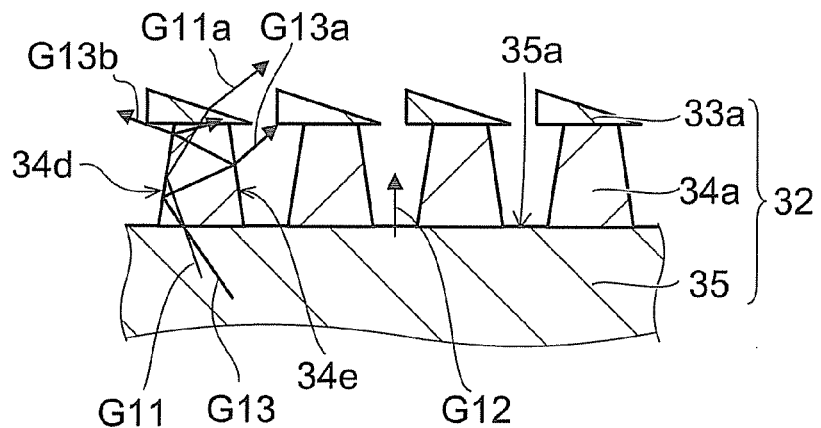
FIG. 8B is a second variation thereof.
Figure 8C:
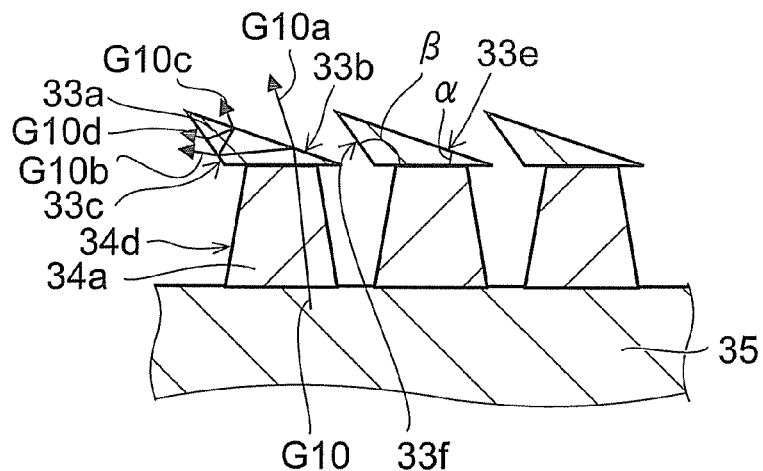
FIG. 8C is a third variation thereof.

FIG. 8A, FIG. 8B, and FIG. 8C are schematic cross-sectional views of light extraction surfaces of a first variation, a second variation, and a third variation of the third embodiment, respectively.

In FIG. 8A, the Al composition ratio y of a second layer 34 is inclined along the depth direction from 0.3 to 0.7. As a result, a pillar 34a becomes finer in a deeper part. Therefore, the adhesiveness is improved between a sealing layer and a current spreading layer 32.

In FIG. 8B, the Al composition ratio y of the second layer 34 is reduced from 0.7 to 0.3 along with the depth. As a result, the pillar 34a becomes thicker along with the depth. In this case, light G11 enters a sidewall 34d of the pillar 34a to be totally reflected, and then becomes output light G11a from the convex structure 33a. Furthermore, light G13 enters a sidewall 34e after totally reflected by the side wall 34d and generates transmitted light G13a and reflected light. The reflected light generates output light G13b and reflected light from the sidewall 34d. In this manner, reflection and transmission are repeated, and it is possible to increase the light extraction efficiency. Moreover, light G12 also can be output from an exposed surface 35a of a third layer 35.

FIG. 8C shows a convex structure 33a having a saw-tooth-shaped cross-section as in the second embodiment. That is, when the convex structure 33a is made of $In_x(Al_yGa_{1-y})_{1-x}P$ ($0\leq x\leq 1$ and $0\leq y\leq 1$), a plane tilted from the {100} plane with an angle between 10 degrees and 20 degrees, for example, is used as the crystal growth plane. In addition, more preferably, the tilt angle from the {100} plane is the (111) group-III plane direction or the (111) group-V plane direction.

Furthermore, the base angle β of the convex structure 33a is configured to be 90 degrees or more. In the emission light, light G10 which has passed through a pillar 34a and entered the convex structure 33a enters a first side surface 33b and branches into transmitted light G10a toward the outside and reflected light. The reflected light enters a second side surface 33c and generates transmitted light G10b and reflected light. The reflected light at the second side surface 33c enters the first side surface 33b again and becomes transmitted light G10c and reflected light. The reflected light is extracted from the second side surface 33c as transmitted light G10d. In this manner, reflection and transmission are repeated many times and thus, the light extraction efficiency can be increased. Furthermore, light which has entered the sidewall from the inside of the pillar 34a enters the convex structure 33a and can be extracted to the outside after repeating transmission and reflection. Accordingly, the light extraction efficiency can be increased up to 145% in comparison with the case without convex structures. Further, it has been found from an experiment by the inventors that the light extraction efficiency can be improved to 150% when the other base angle α of the convex structure 33a is between 35 degrees and 45 degrees, in comparison with the light extraction efficiency of a light emitting element having a flat light extraction surface without convex structures.

As described above, according to the first to third embodiments and the accompanying variations, it is possible to provide a semiconductor light emitting element having improved light extraction efficiency by controlling the shape of the convex structures. These light emitting elements can be widely used in illumination devices, display devices, traffic signals, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting element, comprising:
a light emitting layer capable of emitting light; and
a current spreading layer of a first conductivity type having a first surface and a second surface, wherein,
the light emitting layer is provided on the first surface,
the second surface including a light extraction region and a flat contact region,
the light extraction region having a plurality of convex structures with triangle cross-sectional shape,
a bottom portion of each of the plurality of convex structures with triangle cross-sectional shape is parallel to a crystal growth plane, wherein the plurality of convex structures with triangle cross-sectional shape is below the flat contact region at the second surface of the current spreading layer,
one of base angles of each of the plurality of convex structures with triangle cross-sectional shape is more than 90 degrees,
the other of the base angles of each of the plurality of convex structures with triangle cross-sectional shape is between 35 degrees and 45 degrees, and
the current spreading layer includes one of $In_x(Al_yGa_{1-y})_{1-x}P$ ($0 \le x \le 1$ and $0 \le y \le 1$), $Al_xGa_{1-x}As$ ($0 \le x \le 1$), $In_x(Al_yGa_{1-y})_{1-x}As_zP_{1-z}$ ($0 \le x \le 1$, $0 \le y \le 1$ and $0 \le z \le 1$), and $In_xAl_yGa_{1-x-y}N$ ($0 \le x \le 1$, $0 \le y \le 1$, and $x+y \le 1$).

2. The element according to claim 1, wherein the crystal growth plane is tilted from a {100} plane with an angle between 10 degrees and 20 degrees.

3. The element according to claim 2, further comprising:
a support substrate provided on a side of the light emitting layer opposite to the current spreading layer;
a layer of a second conductivity type provided between the light emitting layer and the support substrate; and
a reflection layer provided between the support substrate and the layer of the second conductivity type and reflecting the emission light from the light emitting layer,
a part of light reflected by the reflection layer being extracted from the light extraction surface.

4. The element according to claim 1, wherein
the light emitting layer and the current spreading layer include a compound semiconductor made of group-III elements and group-V elements, and
the compound semiconductor includes at least one of $In_x(Al_yGa_{1-y})_{1-x}P$ ($0 \le x \le 1$ and $0 \le y \le 1$), $Al_xGa_{1-x}As$ ($0 \le x \le 1$), $In_x(Al_yGa_{1-y})_{1-x}As_zP_{1-z}$ ($0 \le x \le 1$, $0 \le y \le 1$ and $0 \le z \le 1$), and $In_x(Al_yGa_{1-x-y})N$ ($0 \le x \le 1$, $0 \le y \le 1$, and $x+y \le 1$).

5. The element according to claim 4, wherein the crystal growth plane is tilted from a {100} plane toward a (111) group-III plane or a (111) group-V plane.

6. The element according to claim 4, further comprising:
a support substrate provided on a side of the light emitting layer opposite to the current spreading layer;
a layer of a second conductivity type provided between the light emitting layer and the support substrate; and
a reflection layer provided between the support substrate and the layer of the second conductivity type and reflecting the emission light from the light emitting layer,
a part of light reflected by the reflection layer being extracted from the light extraction surface.

7. The element according to claim 1, further comprising:
a support substrate provided on a side of the light emitting layer opposite to the current spreading layer;
a layer of a second conductivity type provided between the light emitting layer and the support substrate; and
a reflection layer provided between the support substrate and the layer of the second conductivity type and reflecting the emission light from the light emitting layer,
a part of light reflected by the reflection layer being extracted from the light extraction surface.

8. A semiconductor light emitting element, comprising:
a light emitting layer capable of emitting light; and
a current spreading layer of a first conductivity type having a first surface and a second surface, wherein,
the light emitting layer is provided on the first surface,
the second surface including a light extraction region and a flat contact region,
the light extraction region having a plurality of convex structures with triangle cross-sectional shape,
a bottom portion of each of the plurality of convex structures with triangle cross-sectional shape is parallel to a crystal growth plane, wherein the plurality of convex structures with triangle cross-sectional shape is below the flat contact region at the second surface of the current spreading layer,
a crystal orientation of the crystal growth plane is tilted from a {100} plane with an angle between 10 degrees and 20 degrees,
one of base angles of each of the plurality of convex structures with triangle cross-sectional shape is more than 90 degrees,
the other of the base angles of each of the plurality of convex structures with triangle cross-sectional shape is between 35 degrees and 45 degrees, and
the current spreading layer includes one of $In_x(Al_yGa_{1-y})_{1-x}P$ ($0 \le x \le 1$ and $0 \le y \le 1$), $Al_xGa_{1-x}As$ ($0 \le x \le 1$), $In_x(Al_yGa_{1-y})_{1-x}As_zP_{1-z}$ ($0 \le x \le 1$, $0 \le y \le 1$ and $0 \le z \le 1$), and $In_xAl_yGa_{1-x-y}N$ ($0 \le x \le 1$, $0 \le y \le 1$, and $x+y \le 1$).

9. The element according to claim 8, further comprising:
a support substrate provided on a side of the light emitting layer opposite to the current spreading layer;
a layer of a second conductivity type provided between the light emitting layer and the support substrate; and
a reflection layer provided between the support body and the layer of the second conductivity type and reflecting the emission light from the light emitting layer,
a part of light reflected by the reflection layer being extracted from the light extraction surface.

10. The element according to claim 9, wherein the crystal growth plane is tilted from a {100} plane toward a (111) group-III plane or a (111) group-V plane.

* * * * *